(12) United States Patent
Conn

(10) Patent No.: US 6,945,712 B1
(45) Date of Patent: Sep. 20, 2005

(54) FIBER OPTIC FIELD PROGRAMMABLE GATE ARRAY INTEGRATED CIRCUIT PACKAGING

(75) Inventor: Robert O. Conn, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 234 days.

(21) Appl. No.: 10/376,915

(22) Filed: Feb. 27, 2003

(51) Int. Cl.[7] .............................................. G02B 6/42
(52) U.S. Cl. .............................. 385/94; 385/92; 385/93
(58) Field of Search .............................. 385/88, 89, 92, 385/94; 257/678

(56) References Cited

U.S. PATENT DOCUMENTS

| | | | |
|---|---|---|---|
| 4,210,923 A | 7/1980 | North et al. | |
| 5,017,263 A | 5/1991 | Clark | |
| 5,319,725 A | 6/1994 | Buchmann et al. | |
| 5,412,748 A | 5/1995 | Furuyama et al. | |
| 5,708,743 A | 1/1998 | DeAndrea et al. | |
| 5,802,228 A | 9/1998 | Bock et al. | |
| 5,937,124 A | 8/1999 | Roff | |
| 5,978,401 A | 11/1999 | Morgan | |
| 5,999,675 A | 12/1999 | Sugiyama | |
| 6,169,833 B1 | 1/2001 | Goossen et al. | |
| 6,301,401 B1 | 10/2001 | La | |
| 6,304,436 B1 | 10/2001 | Branch et al. | |
| 6,353,250 B1 | 3/2002 | Fukano | |
| 6,364,542 B1 * | 4/2002 | Deane et al. | 385/92 |
| 6,384,473 B1 | 5/2002 | Peterson et al. | |
| 6,392,256 B1 | 5/2002 | Scott et al. | |
| 6,456,766 B1 | 9/2002 | Shaw et al. | |
| 6,477,297 B1 | 11/2002 | DeMeritt et al. | |
| 6,480,639 B2 | 11/2002 | Hashimoto et al. | |
| 6,488,417 B2 * | 12/2002 | Kropp | 385/88 |
| 6,497,518 B1 * | 12/2002 | Deane | 385/92 |
| 6,504,977 B1 | 1/2003 | Krishnamoorthy | |
| 6,655,854 B1 * | 12/2003 | Nguyen et al. | 385/88 |
| 6,843,606 B2 * | 1/2005 | Deane et al. | 385/92 |

OTHER PUBLICATIONS

Texas Instruments, "Optical Signal Processing For Today's Dynamic Networks," DLP Products: Optical Networking, 2002, 2 pgs., available from Texas Instruments, 6550 Chase Oaks Blvd., Plano, TX., 75023, www.ti.com/sc/onetsolutionsguide.

Walter Duncan, Benjamin Lee, Paul Rancuret, Bryce Sawyers, Wes Stalcup, Lynn Endlsley and Don Powell, Society Of Photo-optical Instrumentation Engineers, "DLP Switched Blase Grating; the Heart of Optical Signal Processing," 2003, Pgs., 1-8, vol. 4983, available from Texas Instruments, 6550 Chase Oaks Blvd., Plano, TX., 75023.

(Continued)

Primary Examiner—Frank G. Font
Assistant Examiner—James P. Hughes
(74) Attorney, Agent, or Firm—T. Lester Wallace; Kim Kanzaki

(57) ABSTRACT

An FPGA is readily connectable to a high-speed fiber optic link by snap fitting an external fiber optic cable into an accommodating duplex fiber optic connector of a low-profile packaged FPGA integrated circuit. The low-profile packaged FPGA integrated circuit includes a die-bonded assembly disposed within a co-fired multilayer ceramic integrated circuit package. The die-bonded assembly includes the optoelectronic die, the bottom surface of which is die-bonded and electrically interconnected by micropads to the upper surface of the core of an FPGA integrated circuit die. A first optical fiber communicates light from the connector, through the package, and to a photodetector on the optoelectronic die. A second optical fiber communicates light from a laser diode on the optoelectronic die, through the package, and to the connector. In some embodiments, a micromirror device is disposed within the package to redirect light between the optoelectronic die and the optical fibers.

17 Claims, 10 Drawing Sheets

OTHER PUBLICATIONS

G. Scott Glaesemann and Robert J. Castilone, "The Mechanical Reliability of Corning Optical Fiber in Bending," Sep. 2002, WP3690, TL 9000 Registered, available from Corning Incorporated, One Riverfront Plaza, Corning, NY., 14831, www.corning.com/opticalfiber.

Xilinx, Inc., "The Programmable Logic Data Book, (1998)" XC4000E and XC4000X Series Field Programmabel Gate Arrays, Nov. 10, 1997, pp. 4-5 through 4-68, Version 1.4, available from Xilinx, Inc., 2100 Logic Drive, San Jose, CA., 95124.

U.S. Appl. No. 10/377,512, filed Feb. 27, 2003, Conn.

* cited by examiner

RECESSED MICROPAD

PROTRUDING MICROPAD

FIBER OPTIC FIELD PROGRAMMABLE GATE ARRAY INTEGRATED CIRCUIT PACKAGING

FIELD OF THE INVENTION

The present invention relates to fiber optic integrated circuit packages.

BACKGROUND INFORMATION

As the amount of functionality built into field programmable gate arrays (FPGAs) increases and as electronic systems increase in throughput and signaling speed, the amount of information flowing into and out of FPGAs has increased. It is envisioned that soon many FPGA devices will be input/output (I/O) limited or the operation of the FPGA devices will be hampered by inadequate capacity to get information into and out of the FPGA package. Future FPGA devices may be I/O limited both in terms of not having enough space at the periphery of the FPGA die to accommodate additional I/O functionality, and in terms of the speed of the on-chip I/O facilities being too slow to communicate the desired amount of information in the amount of time available.

FPGAs see increasing use in networking applications. A networking application may, for example, involve a printed circuit board that has a connector by which circuitry on the printed circuit board communicates with circuitry on a motherboard or main panel or back panel. Such a printed circuit board may, for example, be called a line card. One or more fiber optic connector jacks are typically provided on the optical line card. External fiber optic cables carrying network communications plug into the fiber optic connector jacks on the line card. Networking information flows from the fiber optic cable, through the fiber optic connector and onto the line card, through an optical-to-electrical transceiver on the line card, through other interface circuitry on the line card such as a serializer/deserializer (SERDES), and to the FPGA. In the other direction, information flows from the FPGA, through the SERDES, through an electrical-to-optical transceiver, through the fiber optic connector, and into the external fiber optic cable.

Typically each of the optical transceiver devices, the SERDES devices, and other intervening devices is packaged in its own package. These devices are therefore interconnected by relatively large electrical conductors and circuit board traces. High speed switching on these conductors in combination with the relatively large parasitic capacitance and inductances of these conductors results in an undesirably large amount of power consumption.

In addition to high power consumption, the design of the printed circuit board traces used to communicate information between these devices may be a daunting and time-consuming task for many FPGA users. High speed printed circuit board design can involve complex considerations and problems.

In addition to the difficulties associated with high speed printed circuit board design, disposing each of the various devices in its own separate package increases the aggregate packaging cost involved in realizing the system.

Not only are fiber optic communications desirable to interface an FPGA to a network such as in the line card example described above, but fiber optic communications are also desirable for other reasons. For example, there are situations where multiple large and high speed FPGAs are to be used together to realize a fairly complex system on a single printed circuit board. It may be desirable to communicate a large number of signals between these FPGAs at a high speed. The task of designing a great many high speed communication paths between the two FPGAs may be a difficult and time-consuming task. If a complex multi-layer printed circuit board is used for this purpose, the communication paths realized as traces on the printed circuit board are inflexible. If a path is to be changed, then a trace on the printed circuit board will have to be changed and the printed circuit board may have to be refabricated. The use of a printed circuit board to make large numbers of independent communication channels between such FPGAs is, therefore, be cumbersome. A solution to this problem is desired.

U.S. Pat. No. 6,364,542 illustrates an optoelectronic module that is fixed by an adhesive to the top of an integrated circuit package. The module contains optoelectronic devices such as, for example, a laser diode and a photodetector. The optoelectronic devices within the module communicate electrically with the central core of an integrated circuit in the package below via bond balls and associated posts that extend up from the integrated circuit in the package, through the integrated circuit package, through the base of the module, and to the optoelectronic devices. An external connector of a fiber optic cable snaps onto the module such that light from one fiber of the cable is transmitted onto the photodetector and such that light generated by the laser diode is transmitted to another fiber of the cable.

Although the package disclosed in U.S. Pat. No. 6,364,542 may be suitable for certain applications, fabrication and assembly of the integrated circuit package may be restrictively complex. If the clearance between the top of the integrated circuit die and the bottom inside surface of the package is too small, then the bond balls used to make contact with the integrated circuit may actually damage the integrated circuit die. If the clearance is too great, then adequate and repeatable contact between the bond balls and the integrated circuit may not be made. Moreover, the assembly involves placing the optoelectronic devices in a relatively small module and then electrically connecting the optoelectronic devices within the module to the integrated circuit die in the underlying integrated circuit package. This assembly introduces undesirable assembly steps and testing steps. It is desired that assembly of the complete package including a fiber optic connector be performed in a single controlled environment.

Not only is the assembly process complex, but the bond balls and posts used to connect the integrated circuit die to the optoelectronic die are large in comparison to the size of transistors and conductor lines on the integrated circuit die. Running high speed signals over the large bond balls and posts results in increased power consumption.

An improved package is desired.

SUMMARY

A packaged FPGA integrated circuit includes a die-bonded assembly disposed within an integrated circuit package. The integrated circuit package includes a fiber optic connector that is connected to a cap portion of the integrated circuit package. A hermetically sealed chamber is formed when the cap portion is fitted onto a base portion of the integrated circuit package. The die-bonded assembly is disposed within this hermetically sealed chamber. The die-bonded assembly includes an optoelectronic die, the bottom surface of which is die-bonded to the upper surface of an FPGA integrated circuit die.

A first optical fiber extends in a direction substantially parallel to the plane of the upper surface of the FPGA die, from the fiber optic connector, through a first hole in the cap portion of the integrated circuit package, and to a reflecting surface. The reflecting surface reflects light exiting from the first optical fiber approximately ninety degrees such that the light is incident on a photodetector on the upper surface of the optoelectronic die. Accordingly, when an external fiber optic cable is snap fit onto the connector of the integrated circuit package, light passes from an optical fiber in the external cable, through the optical connector of the integrated circuit package, through the first optical fiber and to the reflecting surface. The light is reflected by the reflecting surface so that it is incident on the photodetector. The photodetector converts the light into an electrical signal. The electrical signal and/or information contained in the electrical signal is then communicated via small micropad structures from the optoelectronic die and down into the central core of the FPGA die.

A second optical fiber extends parallel to the first optical fiber through a second hole in the cap portion of the integrated circuit package. Information from the FPGA die is communicated via small micropad structures up to the optoelectronic die above. The information is converted into light by a light generating device (for example, a laser diode) disposed on the upper surface of the optoelectronic die. The light is emitted upward in a direction substantially perpendicular to the upper surface of the optoelectronic die, is reflected off the reflecting surface such that the light is redirected approximately ninety degrees and is incident on the second optical fiber. The light passes through the second optical fiber in a direction substantially parallel to the upper surface of the FPGA die, through the second hole in the cap portion of the integrated circuit package and to the fiber optic connector of the integrated circuit package. In the event the external fiber optic cable is snap fit onto the connector of the integrated circuit package, the light passes from the connector and into a second optical fiber of the fiber optic cable.

The packaged FPGA integrated circuit is advantageous in that it has a thin profile, low power consumption, and assembly-related advantages. These and other advantages are described in the detailed description below.

In a second embodiment, a low bend radius optical fiber is used as a waveguide between the fiber optic connector of the integrated circuit package and the optoelectronic die to both conduct light through a hole in the cap portion of the package as well as to change the propagation direction of the light approximately ninety degrees. No prism, lens, or reflecting surface on the cap portion is necessary in this embodiment.

In a third embodiment, the fiber optic connector is connected to the top surface of the cap portion such that an axial bore of a ferrule of the connector extends in a direction perpendicular to the upper surface of the optoelectronic die within the hermetically sealed chamber. A straight section of optical fiber extends from the ferrule of the connector, down through the cap portion of the package, and to the surface of the optoelectronic die. In this embodiment, there is no reflecting surface. Light passing through the optical fiber passes in a direction substantially perpendicular to the upper surface of the optoelectronic die.

In a fourth embodiment, an optoelectronic die is coupled to the FPGA die such that the upper surface of the optoelectronic die is disposed at a ninety degree angle with respect to the upper surface of the FPGA die. An optical fiber extends in a direction substantially parallel to the upper surface of the FPGA die from a fiber optic connector of the package, through a hole in a cap portion of the integrated circuit package, and to the optoelectronic die without being redirected ninety degrees by any reflecting surface or structure.

In a fifth embodiment, the photodetector and light generating devices of the optoelectronic die are edge-detecting and edge-transmitting devices, respectively. V-shaped grooves are etching into the upper surface of the optoelectronic die to align optical fibers to the edge-detecting and edge-transmitting devices.

In a sixth embodiment, a micromirror device is fixed to the inside surface of the cap portion of the integrated circuit package. Electrical signal conductors extend from the FPGA die, through the base portion of the package, up through the cap portion of the package, and to the micromirror device so that the micromirror device is controlled by the FPGA die. An optical fiber is used to direct light from a fiber optic connector of the package, through the wall of the cap portion, and to the micromirror device. The micromirror device focuses or directs light exiting the optical fiber onto the photodetector of the optoelectronic die. Similarly, the micromirror device is usable to focus or direct light emitted from a light generating device of the optoelectronic die onto a second optical fiber used to communicate light out of the integrated circuit package. This allows for misalignments between the optical fibers, micromirror device, and/or the optoelectronic device.

In a seventh embodiment, a multi-fiber bundle is extended into the integrated circuit package and a plurality of individual photodetectors are disposed on the optoelectronic die. The individual micromirrors of the micromirror device are used to establish a plurality of independent communication channels between the individual optical fibers of the bundle and the individual photodetectors of the optoelectronic die. The micromirror device is also usable as a splitter to direct part of the incoming light from the first optical fiber onto the optoelectronic part and part of the light back out of the package via the second optical fiber.

In an eighth embodiment, an array of photodetector/oscillators are distributed across the surface of the FPGA die. No optoelectronic die is provided. An optical fiber is used to communicate an optical clock signal from a fiber optic connector of the package to a plurality of micromirrors of a micromirror device, where the micromirror device is fixed to the inside of the cap portion of the package. Each of the micromirrors directs a portion of the optical clock signal onto a corresponding one of the photodetector/oscillators. The optical clock signal is received by the photodetector of a photodetector/oscillator and is converted into a corresponding electric signal. The electrical signal pumps an oscillator of the photodetector/oscillator such that the oscillator oscillates at the same frequency and in phase with each other photodetector/oscillator on the FPGA die. The oscillating signal of the oscillator is buffered and is then usable locally on the FPGA die in the area of the photodetector/oscillator. In this manner, a low-skew clock signal that is relatively jitter-free is distributed over the entire surface area of an FPGA die.

In a ninth embodiment, a laser diode is disposed at the apex of a pyramid-shaped FPGA integrated circuit package. An electrical clock signal is supplied onto a terminal of the package, and is directed up to the laser diode. The laser diode converts the electrical clock signal into an optical clock signal. The optical clock signal floods the interior hermetically-sealed chamber of the package such that the optical clock signal is incident on all the photodetector/ oscillators on the upper surface of the FPGA die. A dispersing lens may be used to spread out the optical clock signal so that it floods the chamber. Each of the photodetector/oscillators receives the optical clock signal and outputs an electrical clock signal. The result is a low-skew electrical clock signal that is relatively jitter-free and is distributed over the entire surface area of the FPGA die.

A multiplexer is optionally disposed in the signal path between the FPGA die and the laser diode such that another signal can be selected to drive the laser diode. For example, a serial data signal can be received onto the packaged integrated circuit. A clock recovery circuit recovers a clock signal from a serial data signal. The recovered clock signal can then be selectively coupled by the multiplexer onto the conductor extending to the laser diode. Alternatively, an external crystal is coupled to an on-board oscillator. A clock signal generated by the on-board oscillator is selectively coupled by the multiplexer onto the signal path to the laser diode. Alternatively, an external crystal oscillator can be used to supply an electrical clock signal that drives the light generating device.

Other structures and methods are described in the detailed description below. This summary does not purport to define the invention. The invention is defined by the claims.

DETAILED DESCRIPTION

Figure 1:
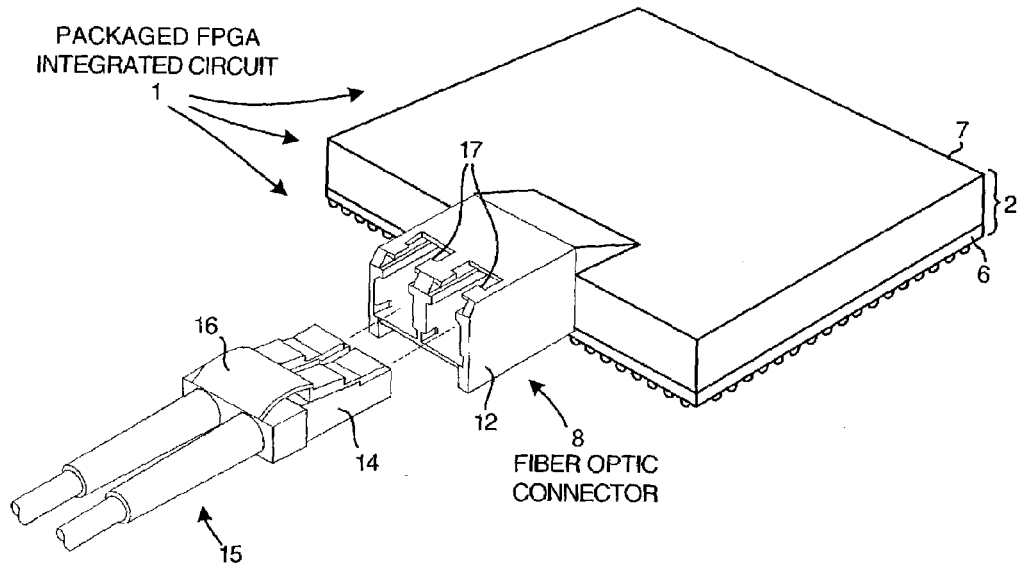
FIG. 1 is a simplified top-down conceptual diagram of a packaged FPGA integrated circuit in accordance with an embodiment of the present invention.
Figure 2:
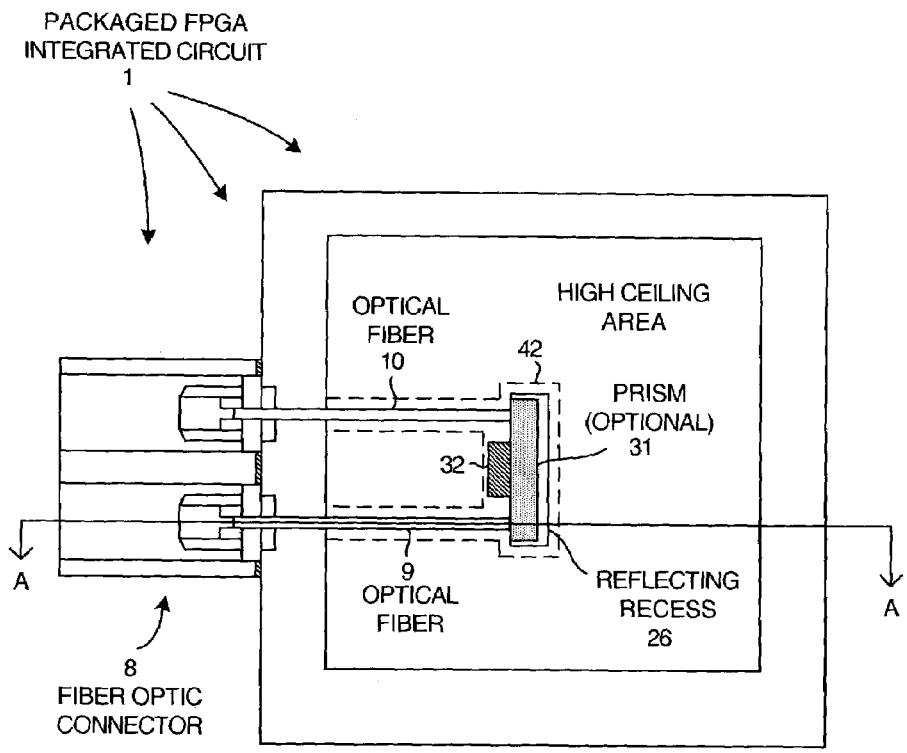
FIG. 2 is a top-down cross-sectional view of the packaged FPGA integrated circuit of FIG. 1.
Figure 3:
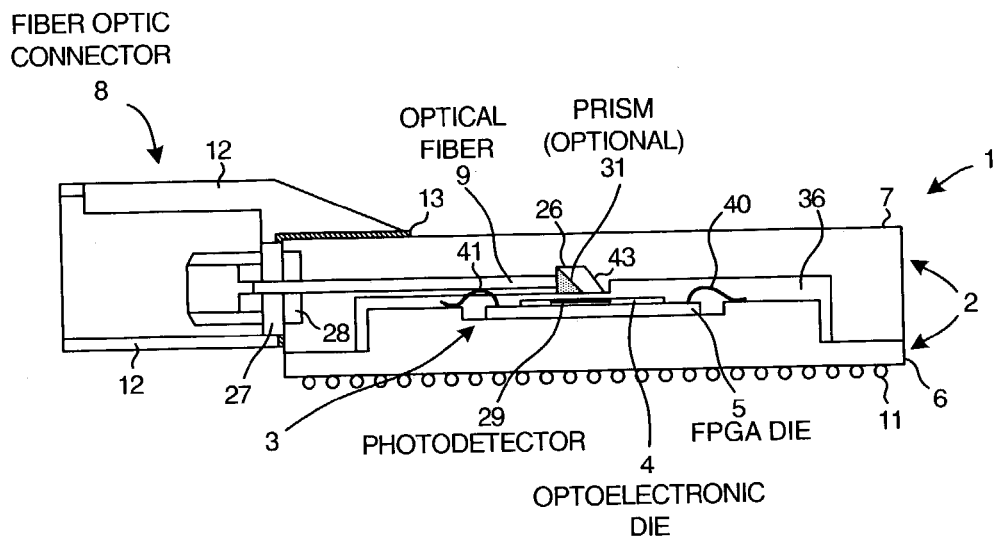
FIG. 3 is a cross-sectional side view of the packaged FPGA integrated circuit of FIG. 1.

FIG. 1 is a perspective view of a packaged field programmable gate array (FPGA) integrated circuit 1 in accordance with one embodiment. FIG. 2 is a cross-sectional top-down view of the packaged FPGA integrated circuit 1 of FIG. 1. FIG. 3 is a cross-sectional side view of the packaged FPGA integrated circuit 1 of FIG. 2, taken along sectional line A—A.

As shown in FIG. 3, packaged FPGA integrated circuit 1 includes an integrated circuit package 2 and a die-bonded assembly 3. Die-bonded assembly 3 includes a thin optoelectronic die 4 and a logic integrated circuit die 5. The bottom and backside surface of optoelectronic die 4 is die-bonded to the upper surface of logic integrated circuit die 5. Logic integrated circuit die 5 in the present example is a field programmable gate array (FPGA) die.

Integrated circuit package 2 is a ceramic ball grid array (BGA) type integrated circuit package that includes a ceramic base portion 6, a ceramic cap portion 7, a fiber optic connector 8, a first optical fiber 9, and a second optical fiber 10. Solder bond bumps or bond balls 11 on the bottom surface of ceramic base portion 7 are usable to attach the integrated circuit package to a printed circuit board (not shown). Fiber optic connector 8 in the illustrated example is an LC small form factor (SFF) type duplex fiber optic connector. A jack receptacle portion 12 of connector 8 is fixed to ceramic cap portion 7 by adhesive 13. Jack receptacle portion 12 can, for example, be an injection molded plastic part. Alternatively, receptacle portion 12 is a machined metal piece, in which case receptacle portion 12 can be soldered to a metal surface of ceramic cap portion 7. Other ways of attaching connector 8 are acceptable.

As shown in FIG. 1, jack receptacle portion 12 is adapted to receive a corresponding LC SFF fiber optic plug portion 14 that terminates an external duplex fiber optic cable 15. Plug portion 14 includes a latching mechanism 16 that engages notches 17 in jack receptacle portion 12 such that plug 14 of external fiber optic cable 15 snap fits into connector 8.

Figure 4:
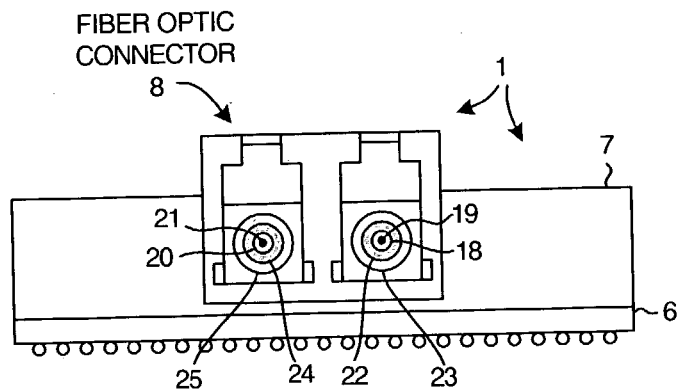
FIG. 4 is a side view of the packaged FPGA integrated circuit of FIG. 1.

As shown in FIGS. 2 and 4, connector 8 is a convenient interface for coupling the external cable 15 to first optical fiber 9 and second optical fiber 10. As shown in FIG. 4, each of the optical fibers includes a central core 19 or 21 through which light travels, as well as a surrounding cladding layer 18 or 20. Core 19 of first optical fiber 9 is surrounded by cladding layer 18 and core 21 of second optical fiber 10 is surrounded by cladding layer 20. Each of the cladding layers is surrounded by a protective jacket at least in the location where the optical fibers extend through connector 8. In one embodiment, the central core is 5 microns in diameter, the cladding layer has an outside diameter of 50 microns, and the jacket has an outside diameter of about 1.25 millimeters.

A barrel-shaped ferrule 22 or 24 has an axial bore. First optical fiber 9 extends at least part way through the axial bore such that ferrule 22 surrounds the end portion of first optical fiber 9. Ferrule 22 is disposed within a sleeve 23. The inside annular surface of sleeve 23 is provided to engage a corresponding ferrule (not shown) of plug 14 of external fiber optic cable 15. Similarly, a barrel-shaped ferrule 24 surrounds the end portion of second optical fiber 10, and ferrule 24 is disposed within a sleeve 25.

FPGA die 5 has an upper face side or surface which receives the bulk of semiconductor processing and upon which the active circuitry of the FPGA is disposed. This upper surface is disposed in a plane. As shown in FIG. 3, first optical fiber 9 extends in a first hole in the cap portion 7 in a horizontal direction parallel to the plane, from connector 8 through cap portion 7, and to a reflecting recess 26 in the top inside surface of cap portion 7. Similarly, second optical fiber 10 extends in a second hole in cap portion 7 in a horizontal direction parallel to the plane from connector 8, through cap portion 7, and to reflecting recess 26.

Assembly of the package may be accomplished by starting with one end of each of the two optical fibers 9 and 10 being attached to connector 8. The loose unattached ends of the two optical fibers 9 and 10 are then slid into their first and second holes, respectively. When a mechanical support portion 27 of connector 8 reaches the leftmost vertical side surface of ceramic cap 7, the loose ends of the first and second optical fibers have extended to the leftmost boundary of reflecting recess 26. At this point connector 8 is glued by an adhesive or is otherwise attached to the vertical side surface and the top surface of ceramic cap 7.

To facilitate mechanical connection of connector 8 to cap portion 7, connector 8 includes in one embodiment a pair of barrel-shaped extensions 28. A corresponding pair of receiving holes is formed into the side surface of cap portion 7. Each of barrel-shaped extensions 28 fits into and is fixed to the annular inside surface of its corresponding hole.

Figure 5:
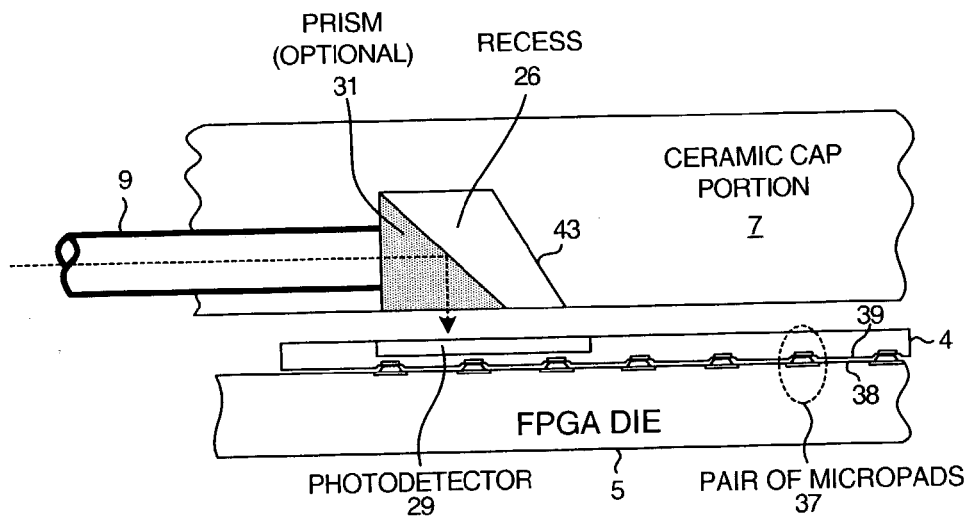
FIG. 5 is an expanded cross-sectional diagram of the reflecting recess and prism of the cap portion of the packaged FPGA integrated circuit of FIG. 1.

FIG. 5 is a more detailed cross-sectional view of reflecting recess 26. Reflecting recess 26 contains a reflecting surface for reflecting light from first optical fiber 9, and redirecting the light approximately ninety degrees so that it is incident onto a photodetector 29 on the upper surface of optoelectronic die 4. Similarly, reflecting recess 26 contains a reflecting surface for reflecting light from a light generating device 30, and redirecting the light approximately ninety degrees into second optical fiber 10. In the example of FIG. 5, the reflecting surface is provided within recess 26 by a prism 31. As shown in the top down perspective in FIG. 2, reflecting recess 26 may include an extension portion 32. An amount of adhesive is disposed in extension portion 32 to fix prism 31 to ceramic cap portion 7 without the adhesive being left in the path of light passing either into or out of optical fibers 9 and 10.

In the present example, photodetector 29 is a resonant cavity photodetector (RCPD) that receives light traveling in a direction perpendicular to the upper surface of optoelectronic die 4. Light generating device 30 of optoelectronic die 4 is a vertical cavity surface emitting laser (VCSEL) diode that emits laser light in a direction perpendicular to the upper surface of optoelectronic die 4. The term "light" here is not limited to visible light, but rather is used to denote electromagnetic radiation of visible and other wavelengths that can be transmitted through optical fibers, that can be received by a semiconductor photodetector, and that can also be generated by a semiconductor light generating device.

Figure 6:
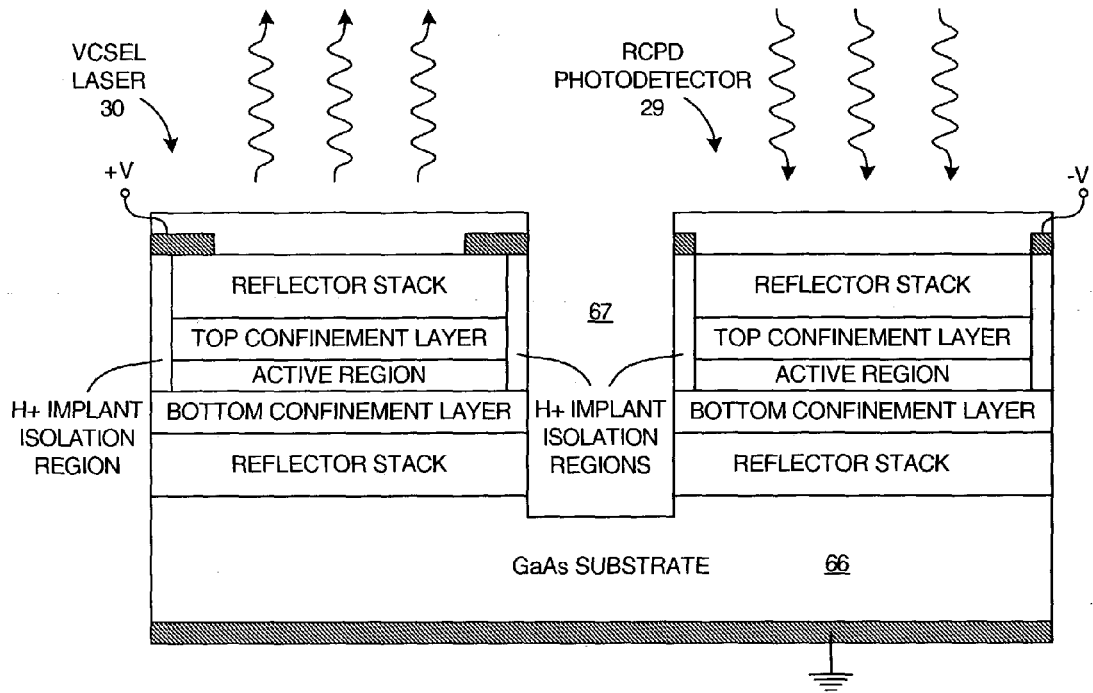
FIG. 6 is a simplified cross-sectional diagram of a light generating device and a photodetector device of an optoelectronic die of the packaged FPGA integrated circuit of FIG. 1.

FIG. 6 is a simplified cross-sectional view of a part of optoelectronic die 4. Optoelectronic die 4 in this case has a gallium arsenide (GaAs) substrate 66. Both photodetector 29 and VCSEL 30 have similar structures including upper and lower reflector stacks, top and bottom confinement layers, and active regions. Semiconductor material disposed between photodetector 29 and VCSEL diode 30 is removed by etching so as to form an isolation region 67. In some embodiments, a light blocking member and/or a light absorbing resin is disposed in the isolation region 67 to block and/or absorb light that would otherwise cause cross-talk problems between the VCSEL laser and the photodetector. For additional information on suitable integrated VCSEL and photodetector devices, see U.S. Pat. No. 5,978, 401 issued Nov. 2, 1999 to Morgan (the subject matter of which is incorporated herein by reference).

Figure 7:
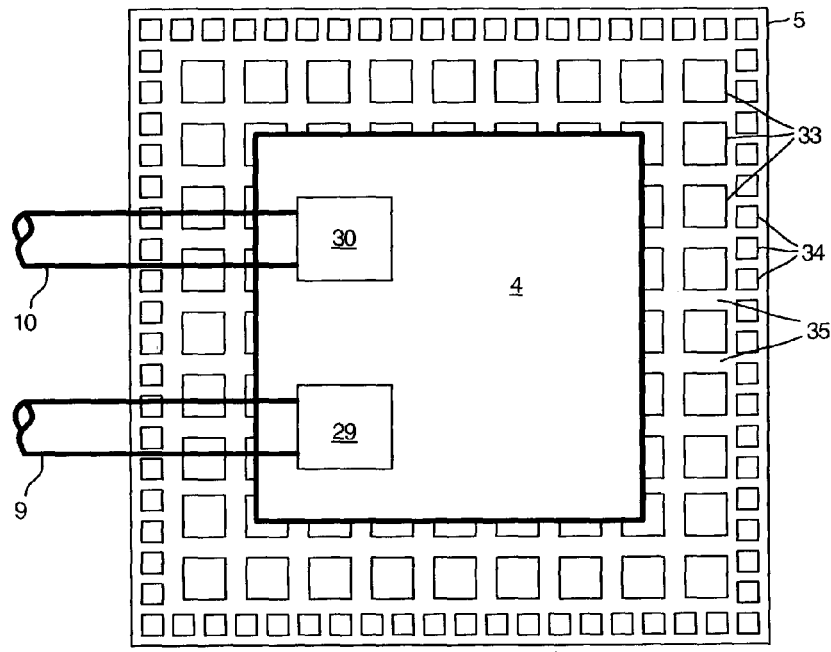
FIG. 7 is a top-down view of the optoelectronic die disposed upon the FPGA die in the packaged FPGA integrated circuit of FIG. 1.

FIG. 7 is a more detailed top-down diagram of optoelectronic die 4 disposed on the upper surface of FPGA die 5. In the present example, FPGA die 5 includes a central core of configurable logic blocks (CLBs) 33 surrounded by a ring of input/output blocks (IOBs) 34. A programmable interconnect structure 35 of the FPGA can be configured by an FPGA user to connect circuitry in selected CLBs and IOBs as desired to realize a user-specific circuit. For additional information on an FPGA, its structure and operation, see: "The Programmable Logic Data Book", by Xilinx Inc., pages 4–5 through 4–68 directed to the XC4000 FPGA, copyright 1998 (the subject matter of which is incorporated herein by reference). Although one particular type of FPGA is set forth here for illustrative and instructional purposes, it is to be understood that other FPGA architectures can be employed. The illustrated FPGA is just an example.

In contrast to the way that electrical signals are communicated in U.S. Pat. No. 6,364,542 from the optoelectronic device in the module to the underlying integrated circuit die in the package, electrical signals are communicated in the present embodiment by considerably smaller pairs of micropad structures. In this embodiment, each micropad is five microns square when viewed from a top-down perspective. Electrical signals are communicated through pairs of such micropads both from the optoelectronic die 4 down into the central core of FPGA 5 as well as from central core of FPGA 5 and up to optoelectronic die 4. Optoelectronic die 4 is die-bonded to FPGA die 5 such that there is no intervening package resin or ceramic packing material between the two dice. The length of the conductors that extend between the two dice is very short. The entire die-bonded assembly 3 is disposed in a single hermetically sealed chamber 36 (FIG. 3) formed within ceramic integrated circuit package 2.

FIG. 5 shows a simplified cross-sectional view of one embodiment of these micropad structures. Dashed oval 37 encircles one pair of these micropad structures. This pair includes one protruding conductive micropad structure disposed on the upper surface 38 of FPGA die 5. The pair also includes one recessed micropad structure disposed on the bottom surface 39 of optoelectronic die 4. When optoelectronic die 4 is brought into contact with FPGA die 5, corresponding protruding and recessed micropads make physical contact with one another such that optoelectronic die 4 is physically bonded to the underlying FPGA die 5. Under pressure, the protruding micropad structures may deform and form weak covalent bonds with recessed micropad structure.

Optional alignment structures (not shown) that are physically larger and mechanically stronger than the small micropad structures may extend down from the bottom surface of die 4 and extend up from the top surface of die 5. These alignment structures are shaped so that they slidingly engage one another as dice 4 and 5 are brought together. Such alignment features can ensure that dice 4 and 5 are properly aligned with respect to one another as the two dice 4 and 5 are brought together. After the two dice 4 and 5 are then properly aligned, the dice 4 and 5 continue to come closer together until the smaller and more fragile protruding micropad structures make contact with the recessed micropad structures.

For additional information on suitable micropad structures and alignment structures for use in connecting dice 4 and 5, see: 1) X-991-1, 2) X-991-2, 3) U.S. Pat. No. 6,271,059 issued to Bertin et al., 4) U.S. Pat. No. 6,114,221 issued to Tonti et al., 5) U.S. Pat. No. 6,410,431 issued to Bertin et al., 6) U.S. Pat. No. 6,444,560 issued to Pogge et al., 7) Published U.S. patent application number U.S. 2002/0064906 by Enquist, and 8) U.S. Pat. No. 6,368,930 issued to Enquist (the entirety of each of these patent documents is hereby incorporated by reference). For information on another metal pad structure suitable for coupling an FPGA die and a second integrated circuit die together, see the description of the Cu—Ta bilayer pads that are fused together by applying a compressive force at 400 degrees C. in the article by Banerjee et al., entitled "3D ICs: A Novel Chip Design for Improving Deep-Submicrometer Interconnect Performance and Systems-on-Chip Integration," Proceedings of the IEEE, vol. 89, No. 5, May 2001, by Banerjee et al. (the subject matter of this paper is hereby incorporated by reference).

One usable micropad structure involves each of the optoelectronic die and the FPGA die having protruding aluminum post micropads. Protruding ends of corresponding pairs of the aluminum post micropads on the two die cold weld to each other when the two die are pressed together such that the only contact between the two dice is through the cold welded aluminum post micropads. The mating surfaces of the ends of the micropads are free of an aluminum oxide layer when they are brought together, thereby facilitating cold welding.

In the embodiment of FIGS. 1–7, each of ceramic base portion 6 ceramic cap portion 7 is, for example, formed by laminating multiple thin ceramic layers together to form a single monolithic ceramic structure having embedded horizontally extending electrical conductors and vertically extending conductive vias. To make a ceramic layer, a powder comprised a ceramic material such as alumina and/or glass is mixed with an organic binder solution to form a paste. The paste is spread into a thin layer and is patterned into the shape desired. The thin layer of patterned paste is then heated to drive off the binder solution. The layer is then sintered at high temperature such that the powdered ceramic constituents are sintered together and form a thin ceramic sheet structure of the desired shape. Metal conductors are then formed on the thin sheet structure, and vias in the sheet structure are plated with metal to form plated through vias. In this way, many thin sheet structures are made. The many thin sheet structures are then clamped together and cofired to form a single monolithic ceramic structure having internal horizontal and vertical electrical connections formed of metal. Glass components flow during the high temperature cofiring to fill small voids in the structure. Using this multilayer technique, cap portion 7 is formed such that cap portion 7 has the holes through which first and second optical fibers 9 and 10 will extend.

Each of the IOBs 34 (see FIG. 7) on the periphery of FPGA die 5 includes a bond bad. These bond pads are wire bonded by bond wires to corresponding bond pads on ceramic base portion 6. FIG. 3 shows two such bond wires 40 and 41. It is desired that the reflecting surface that redirects light to and from the first and second optical fibers be disposed as close to the upper surface of optoelectronic die 4 as is practical. The bond wires, however, extend upward from the upper face surface of FPGA die 5 before they bend back downward and attach to bond pads on ceramic base portion 6. To provide additional headroom for these bond wires, laminated ceramic cap 7 has a dropped ceiling area as well as a higher ceiling area. The dashed line 42 in FIG. 2 designates the boundary of the dropped ceiling area. The dropped ceiling area is provided only in the area of the first and second optical fibers and the reflecting recess. Where the additional ceramic material of the dropped ceiling is not needed to hold the first and second optical fibers or to bring the reflecting surface down closer to the upper surface of optoelectronic die 4, more headroom is provided for wire bonding by providing the higher ceiling.

Operation of packaged FPGA integrated circuit 1 of FIGS. 1–7 is now described. Light (for example, laser light) from one of the optical fibers in external fiber optic cable 15 is transmitted through plug 14, through connector 8 in a direction parallel to the upper surface of FPGA die 5, and into the leftmost end of the core of first optical fiber 9. The light passes through the core of first optical fiber 9 in the direction parallel to the upper surface of FPGA die 5 to reflecting recess 26. The light enters prism 31, and is redirected approximately ninety degrees into a direction substantially perpendicular to the upper surface of FPGA die 5 such that the light is incident on photodetector 29 of optoelectronic die 4. Prism 31 has, in one embodiment, a long bar shape as illustrated in FIG. 2. In some embodiments, there is no prism. Rather, the light is reflected by an angled reflecting surface 43 of reflecting recess 26.

Photodetector 29 on optoelectronic die 4 converts the incident light into a corresponding electrical signal. The electrical signal carries serial information. Optionally, optoelectronic die 4 includes serializer/deserializer (SERDES) circuitry that converts the serial information into parallel information. The parallel information is then transferred in parallel form at a lower frequency from optoelectronic die 4 to the underlying FPGA die 5 through a plurality of micropad pairs. Alternatively, the serial information may be transferred in serial fashion from optoelectronic die 4 to the underlying FPGA die 5 through a single pair of micropads.

Figure 8:
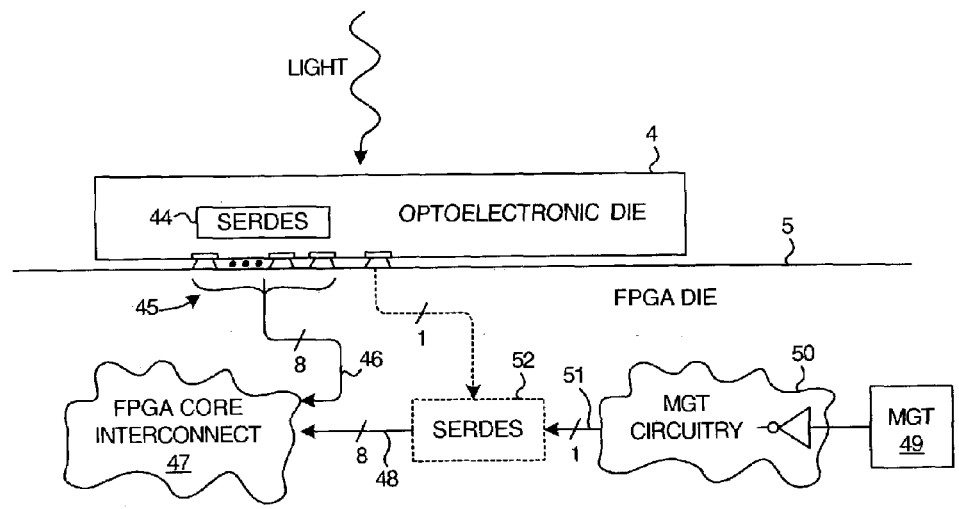
FIG. 8 is a cross-sectional diagram illustrating how information from an optical signal received onto an optoelectronic die is communicated into the central core of an underlying FPGA die in the packaged FPGA integrated circuit of FIG. 1.

FIG. 8 is a simplified diagram that illustrates how the received signal may be directed to the core of FPGA die 5. Block 44 represents a SERDES that is optionally provided on optoelectronic die 4. In the event such a SERDES is provided, eight bits of parallel information passes through eight pairs of micropads 45 and an eight-bit bus 46 to the core 47 of the FPGA. This eight-bit bus 46 is multiplexed onto the same eight-bit bus 48 that is used to receive high-speed information from multigigbit transceiver (MGT) 49. In one embodiment of an FPGA, a MGT 49 is provided. High speed serial information may be received onto MGT 49, processed through MGT receiving circuitry 50, and then passed via one bit line 51 into a SERDES 52. The SERDES 52 converts the serial bit stream into parallel form and passes the parallel data via eight-bit bus 48 to core 47 (and also possibly up to die 4). This data path from MGT 49 to core 47 is conventionally supplied on FPGA devices available today from Xilinx, Inc. of San Jose, Calif. In accordance with one aspect of the present embodiment, information received from optoelectronic die 4 is supplied to core 47 by multiplexing the flow of eight-bit information from bus 46 into the eight-bit data path between MGT 49 and core 47.

An individual micropad when viewed from a top-down perspective is approximately five microns square in this embodiment. Because the micropad structures used to communicate electric signals between dice 4 and 5 are so small, the associated parasitic capacitance and inductance are reduced. Due to the reduced parasitic capacitance and inductance of the connection between the two dice, the amount of power needed to drive very high-speed signals across this connection is also reduced. Signal speeds can therefore be increased.

In addition to reduced power consumption, the FPGA integrated circuit is advantageous in that optoelectronic die 4 and FPGA die 5 can be assembled in a controlled assembly environment where the other packaging operations associated with enclosing die-bonded assembly into a hermetically sealed integrated circuit package are performed. Assembly of the optoelectric device in a module separate from assembly of the FPGA die in hermetically sealed integrated circuit package is avoided. Control of assembly parameters is therefore facilitated and efficiency of the assembly process is promoted.

Information can also pass in the opposite direction from core 47 of FPGA die 5 and up to optoelectronic die 4. One pair of micropads is used if the information is transferred as a single bit stream. Eight pairs of micropads are used if the information is transferred as a sequence of eight-bit values. If eight-bit values are transferred, then the eight-bit values are serialized on optoelectronic die 4 by SERDES 44. Regardless of whether the information is transferred between the two dice in serial or parallel fashion, the result is a single bit electrical signal that is supplied to VCSEL laser diode 30. Multiple such VCSELs can be provided for this purpose.

VCSEL laser diode 30 converts the electrical signal into laser light. The laser light is emitted in the vertical direction perpendicular to the upper surface of FPGA die 5. If prism 31 is provided in reflecting recess 26, then the laser light is reflected ninety degrees by prism 31 so that the light passes into the rightmost end of second optical fiber 10. Alternatively, if no prism 31 or mirror is provided, then the laser light is made to reflect off reflecting surface 43 of the reflecting recess 26. In either case, the laser light is redirected ninety degrees and passes into the rightmost end of second optical fiber 10.

The laser light then travels down second optical fiber 10 through ceramic cap portion 7 in a direction parallel to the upper surface of FPGA die 5. The laser light passes through connector 8, into plug 14, and into a second optical fiber of external fiber optic cable 15. It is therefore seen that an FPGA user can establish duplex (i.e., bidirectional) fiber optic communication with FPGA die 5 simply by plugging an external cable plug into the connector 8 of packaged FPGA integrated circuit 1.

The laser light passing out of an optical fiber typically disperses. If the light passing out of first optical fiber 9 disperses, then not all of that light may be incident on photodetector 29 as desired. To increase the amount of light that reaches photodetector 29, the reflecting surface (for example, prism 31 or reflecting surface 43) that redirects the light ninety degrees is fashioned in some embodiments to focus the light onto a small area of optoelectronic die 4 as desired. Similarly, laser light generated by VCSEL laser diode 30 can disperse such that only a fraction of the generated light passes into second optical fiber 10. To increase the amount of light that passes into second optical fiber 10, the reflecting surface (for example, prism 31 or reflecting surface 43) that redirects the light ninety degrees is fashioned in some embodiments to focus the generated light onto the small core of second optical fiber 10.

Figure 9:
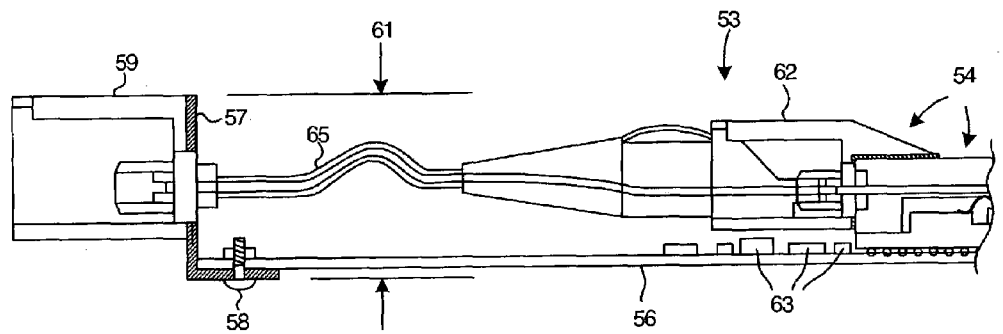
FIGS. 9 and 10 are diagrams illustrating how the packaged FPGA integrated circuit of FIG. 1 can be used to realize a complex system on an expansion card or line card.
Figure 10:
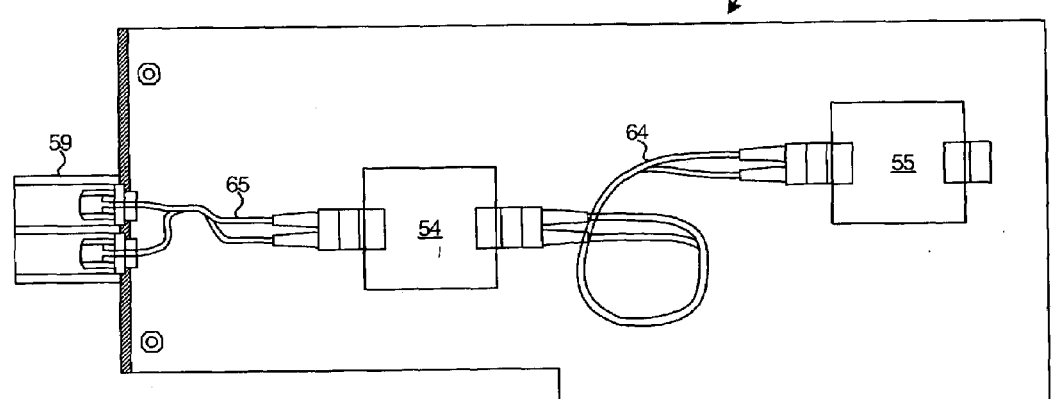

FIG. 9 is a top-down edge view of an expansion card or line card assembly 53. FIG. 10 is side view of the expansion card or line card assembly 53 of FIG. 9. In the illustrated example, there are two packaged FPGA integrated circuits 54 and 55 solder mounted to the printed circuit board portion 56 of card assembly 53. The card assembly 53 includes a metal bezel faceplate 57 that is attached to the printed circuit board 56 by bolt and nut attachment 58. A duplex fiber optic connector 59 is mounted to metal bezel faceplate 57. This duplex fiber optic connector 59 is accessible from the outside of an electronic system box or housing (not shown) when the line card assembly 53 is coupled to a motherboard or other printed circuit board of the electronic system box. In the illustrated example, card assembly 53 is an expansion card that has a card edge connector 60 for coupling into an electronic system box.

In comparison to the relatively tall structure illustrated in U.S. Pat. No. 6,364,542, the packaged FPGA integrated circuits 54 and 55 have a relatively thin profile in dimension 61. This low profile is a significant advantage. The plane in which the upper surface of FPGA die 5 is disposed intersects the two sleeves of the connector 8. As illustrated in FIG. 9, the uppermost extent 62 of the connectors of the packages 54 and 55 is below the height of metal bezel faceplate 57 in dimension 61. Reducing the height of packages 54 and 55 in dimension 61 facilitates use of packages 54 and 55 on expansion cards and line cards.

The size of the LC SFF fiber optic connectors on packaged FPGA integrated circuit 54 can be significant in comparison to the amount of printed circuit board space available on printed circuit board 56. In one embodiment, surface mount electronic components 63 are disposed on printed circuit board 56 as shown in FIG. 9 underneath the connector portion of packaged FPGA integrated circuit 54 between the connector and the printed circuit board.

A complex network-coupled system may require so much circuit functionality that it cannot all be realized on a single FPGA integrated circuit. It is sometimes desirable to be able to use multiple FPGAs to realize the system, but providing all the necessary interconnections and communication of signals between the FPGAs on the printed circuit board may be a time-conduming and complex task. If design of the system changes, then the printed circuit board may have to be redesigned. Such redesign introduces cost, delay and complexity. Moreover, system design may require a large number of independent communication channels between the multiple FPGAs. Providing those many communication channels in the form of traces on a printed circuit board may be difficult and time-consuming as signal speeds increase.

In accordance with one embodiment, each of the packaged FPGA integrated circuits 54 and 55 has not just one duplex connector, but rather has two. Multiple packaged FPGA integrated circuits are interconnected by fiber optic cables in daisy-chain fashion. FIG. 10 shows packaged FPGA integrated circuits 54 and 55 interconnected by duplex fiber optic cable 64. These interconnected packaged FPGA integrated circuits are then usable together to form a single large system. The set of interconnected packaged FPGA integrated circuits is also connected to an external system (for example, a network) by another duplex fiber optic cable 65.

A system designer, rather than having to lay out a complex printed circuit board, can interconnect a great many nodes within the two packaged FPGA integrated circuits 54 and 55 via many independent communication channels established through duplex fiber optic links between the packaged FPGA integrated circuits of the system. In this way, a large and complex system can be built with a minimal amount of printed circuit board layout work.

Electromagnetic interference and transmission problems are avoided. The system designer can obtain the packaged FPGA integrated circuits from the FPGA manufacturer with the characteristics of communication channels specified and with the fiber optic interface functionality tested and ready for use. This manner of providing signal communication between packaged FPGA integrated circuits of a large system is flexible in that the many communication channels provided can be changed by a system designer without having to change any hardware and without having to modify a printed circuit board. The communication channels and which particular nodes on which FPGAs they interconnect is under the control of the FPGAs of the system. The partitioning of the system between the various interconnected FPGAs is therefore software reconfigurable. Information passing into FPGA 54 from an external network via duplex fiber optic cable 65 can be relayed by FPGA 54 and forwarded to FPGA 55 if desired.

Figure 11:
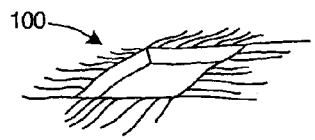
FIGS. 11–20 are diagrams of one suitable micropad structure usable to electrically couple an optoelectronic die to an FPGA die in the packaged FPGA integrated circuit of FIG. 1.
Figure 12:
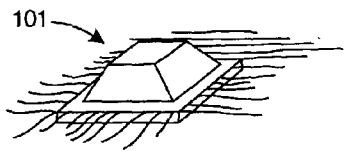

FIG. 11 is a perspective view of a recessed micropad structure 100 disposed on the bottom surface of optoelectronic die 4. FIG. 12 is a perspective view of a protruding micropad structure 101 disposed on the top surface of FPGA die 5.

Figure 13:
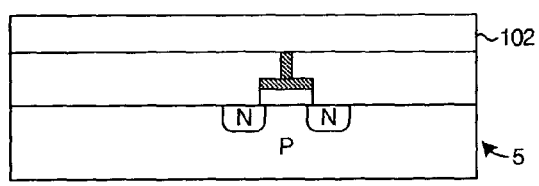
Figure 14:
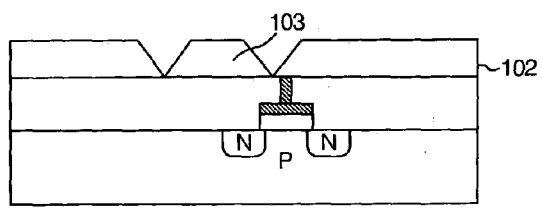
Figure 15:
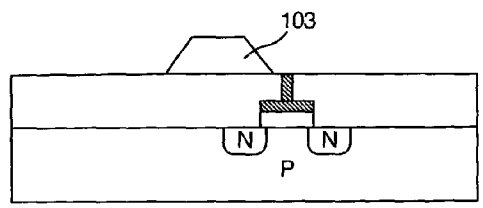
Figure 16:
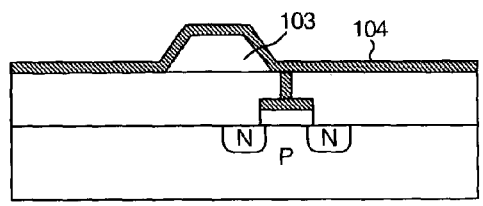
Figure 17:
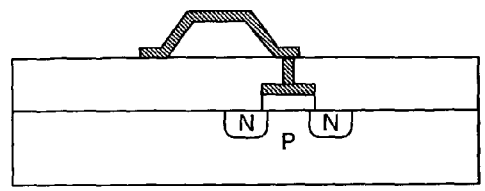
Figure 18:
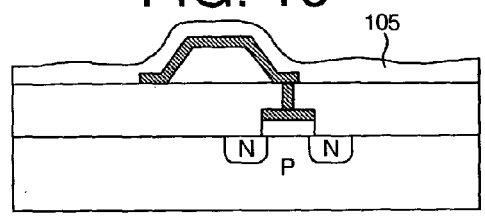
Figure 19:
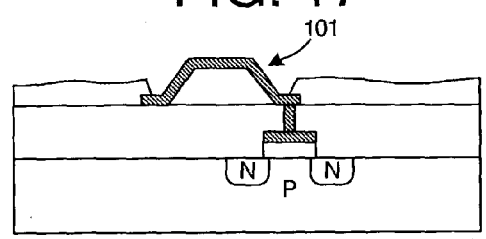

FIGS. 13–19 are cross-sectional diagrams that illustrate one way that protruding micropad structure 101 can be formed. As shown in FIG. 13, an insulating layer 102 such as, for example, silicon dioxide is formed over a FPGA die 5. A V-shaped trench that has a square shape when FPGA die 5 is viewed from the top is then etched into insulating layer 102 as shown in cross-section in FIG. 14 to form a truncated pyramid-shaped structure of insulating material 103. The remainder of insulating layer 102 is removed to leave the truncated pyramid-shaped structure as illustrated in FIG. 15. A layer of metal 104 is then deposited over structure 103 so that the metal makes electrical contact with underlying circuitry of the FPGA that will receive electrical signals from the protruding micropad structure. This metal layer is then patterned to remove excess metal, thereby leaving the structure illustrated in FIG. 17. Next, a layer 105 of insulating material is formed over the structure as shown in FIG. 18. The layer 105 of insulating material is then patterned to expose the metal of the protruding micropad structure 101 as shown in FIG. 19.

Figure 20:
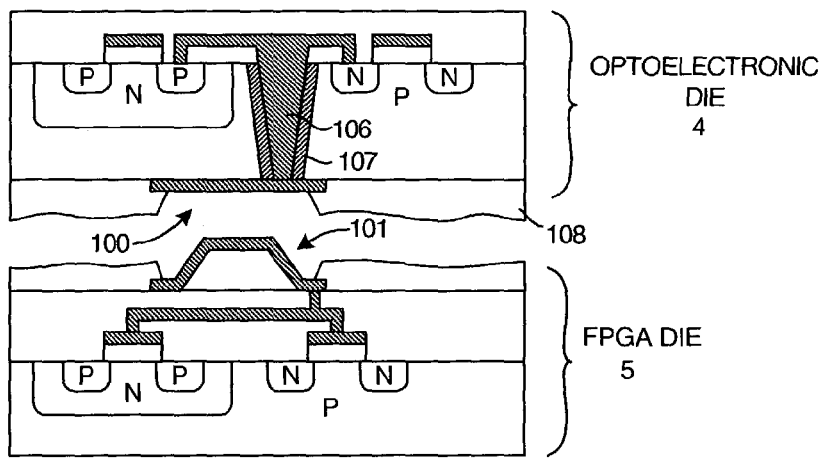

FIG. 20 shows a cross-sectional view of one embodiment of recessed micropad 100 of FIG. 12. Recessed micropad 100 is formed by first etching a deep via into the optoelectronic die 4 from the upper face side of optoelectronic die 4. This via extends past the depth of the active circuitry formed on the surface of the optoelectronic die. The inside surface of the deep via is coated with an insulating layer, for example a layer of silicon dioxide. The via is then filed with metal to form a plug. The backside surface of the optoelectronic die is then ground away until the bottom of the plug is reached. This is done by attaching a supporting member (not shown) to the face side of optoelectronic die 4, and then chemical mechanical polishing the backside of the optoelectronic die 4 until the bottom of the plug is reached. A layer of metal is then formed on the backside surface of die 4 and is patterned to form a micropad metal patch structure 100 that contacts the bottom of the metal plug as illustrated in FIG. 20. FIG. 20 shows the metal plug 106 insulated from the substrate of optoelectronic die 4 by insulator material 107. A layer of an insulating material 108 is then formed over the metal micropad feature, and the insulating layer 108 is patterned and etched to expose the recessed micropad structure 100. The thin optoelectronic die 4 is then pressed together with the underlying FPGA die 5 such that the top surface of the protruding micropad structure 101 contacts and forms a weak bond to recessed micropad structure 100. Once the optoelectronic die 4 is weak bonded to FPGA 5, the supporting member is removed from the optoelectronic die 4.

There are numerous known techniques and structures for die-bonding optoelectronic die 4 to FPGA die 5. The micropad structure set forth in FIGS. 11–20 is but one example. Although each of the optical fibers in the embodiment of FIGS. 1–7 described above extends into the integrated circuit package through its own hole, this need not be the case. For example, the multiple optical fibers used to guide light into the integrated circuit package can pass through an insert that holds the two optical fibers. The insert then fits into an accommodating single hole in the ceramic cap portion. The inserts can be glued or soldered or otherwise made to seal the hole in the ceramic cap portion.

Figure 21:
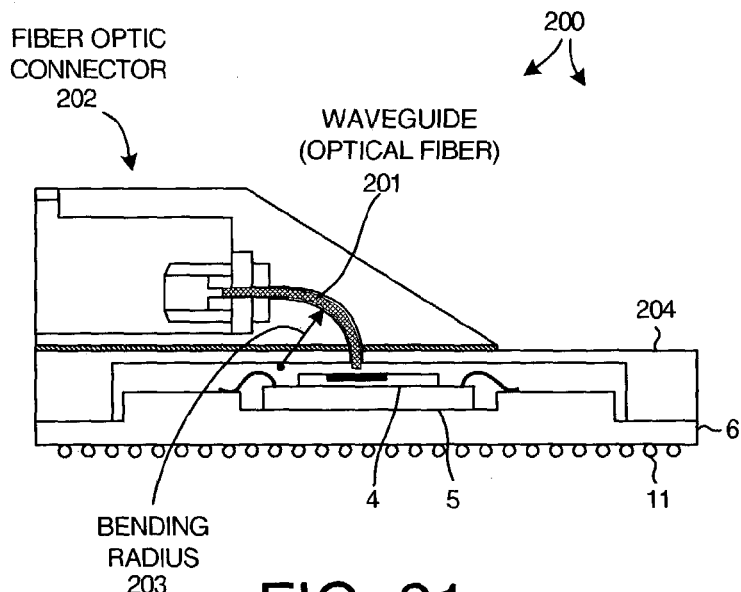
FIG. 21 is a cross-sectional diagram of a second embodiment of a packaged FPGA integrated circuit.

FIG. 21 is a cross-sectional diagram of a second embodiment of a packaged FPGA integrated circuit 200 in accordance with the present invention. In this embodiment, light passing through a first optical fiber 201 from an LC SFF connector 202 is redirected by a bent first optical fiber 201 from a direction substantially parallel to the upper surface of FPGA die 5 to a direction substantially perpendicular to the upper surface of optoelectronic die 4. Although not shown in FIG. 21, light emitted from the light generating device of optoelectronic die 4 is redirected by a second bent optical fiber (not shown) ninety degrees from a direction substantially perpendicular to the upper surface of optoelectronic die 4 to the direction substantially parallel to the upper surface of FPGA die 5. The light from the light generating device is directed by the second optical fiber to a second ferrule and sleeve (not shown) of connector 202. The second ferrule and sleeve are disposed behind the ferrule and sleeve illustrated in FIG. 21.

The first and second optical fibers are, in this embodiment, reduced-cladding-layer low-bending radius erbium-doped fibers. A jacket is provided around the optical fiber core and cladding layer of each fiber only in the area of the connector 202. The bending radius 203 of the optical fibers is approximately six millimeters.

Although the connector 202 and the cap portion 204 can be two separate members that are fixed to one another (for example, by adhesive or solder) as illustrated in FIG. 21, connector 202 and cap portion 204 in other embodiments are integrally formed as one monolithic piece. This monolithic piece may, for example, be a machined metal piece. In one embodiment, optical fiber 201 protrudes downward from the inside ceiling surface of cap portion 204 toward the upper surface of optoelectronic die 4. The end of optical fiber 9 may even be made to contact the upper surface of optoelectronic die 4. Cap portion 204 complete with connector 202 may be attached to base portion 6 so that the two portions 202 and 5 form a hermetically sealed chamber that contains the die-bonded assembly.

Figure 22:
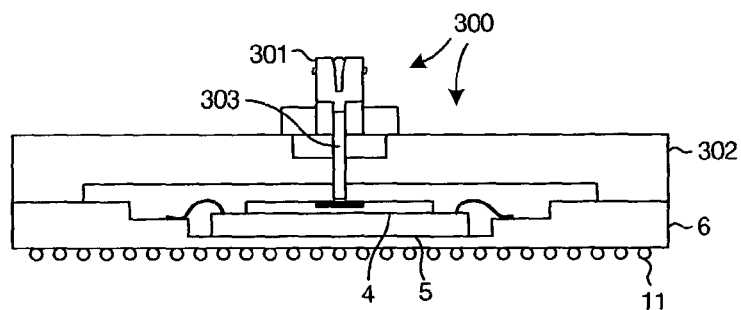
FIG. 22 is a cross-sectional diagram of a third embodiment of a packaged FPGA integrated circuit.

FIG. 22 is a cross-sectional diagram of a third embodiment of a packaged FPGA integrated circuit 300 in accordance with the present invention. In this embodiment, an optical connector 301 is fixed to an upper cap portion 302 of the integrated circuit package. Cap portion 302 of the integrated circuit package can, for example, be made of ceramic, metal or polyimide. An optical fiber 303 extends downward in a direction substantially perpendicular to the upper surface of optoelectronic die 4 from connector 301, through cap portion 302, and to the upper surface of optoelectronic die 4. Optical connector 301 is shown as an ST bulkhead connector. In contrast to the embodiment of FIG. 21, the optical fiber 303 in the embodiment of FIG. 22 does not bend. As in the case of the embodiment of FIG. 21, the optical fiber can be made to touch the upper surface of optoelectronic die 4, or can be spaced so that its end is very close (about 5 microns) to the upper surface of optoelectronic die 4. By reducing the distance between the optical fiber and the light generating device or photodetector, optical coupling between the optical fiber and the light generating device or photodetector is improved. No additional light focusing member, prism, lens or reflecting surface is required in the assembly. Although a connector having one optical fiber is illustrated, a multi-fiber bundle can be used to extend from connector 301 to the upper surface of optoelectronic die 4. Alternatively, a connector having multiple separate optical fibers can be used such that each separate optical fiber extends through a separate hole in cap portion 302. Although one connector is shown, additional connectors may be provided on the same packaged FPGA integrated circuit.

Figure 23:
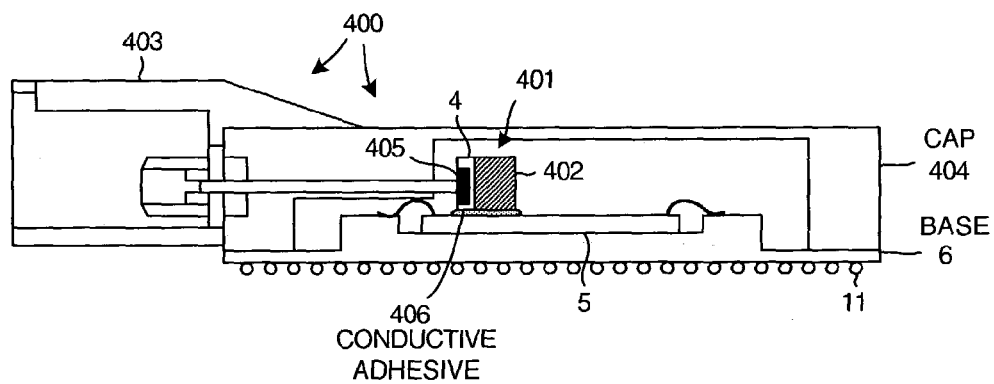
FIG. 23 is a cross-sectional diagram of a fourth embodiment of a packaged FPGA integrated circuit.

FIG. 23 is a cross-sectional diagram of a fourth embodiment of a packaged FPGA integrated circuit 400 in accordance with the present invention. In this embodiment, rather than the backside surface of an optoelectronic die being die-bonded to the upper surface of an FPGA die, an optoelectronic die 4 is mounted on the upper surface of FPGA die 5 such that the plane of the face side of the optoelectronic die 4 is oriented perpendicularly with respect to the plane of the upper surface of FPGA 5. Optoelectronic die 4 is thin. To facilitate mounting of such a thin die on its edge, a relatively thick support wafer is bonded to a wafer of optoelectronic dice. The composite wafer assembly is then sectioned into the relatively thick structures. Thick die structure 401 shown in cross-section in FIG. 23 is one such structure. Portion 402 is a portion of the support wafer. The thick die structure 401 is then mounted on its side on the upper surface of FPGA 5 as shown in FIG. 23. An optical fiber extends from connector 403, through a hole in ceramic cap portion 404 in a direction parallel to the upper surface of FPGA die 5, and to the photodetector 405 on thick die structure 401. Although not shown in the cross-section of FIG. 23, optoelectronic assembly 401 also includes a VCSEL laser diode disposed on the face side surface of optoelectronic die 4. A second optical fiber disposed behind the plane of the illustration of FIG. 23 extends from connector 403, through a second hole (not shown) in cap portion 404, and to the laser diode on optoelectronic assembly structure 401. Alignment of the optical fibers and the photodetector and light generating device on optoelectronic die assembly structure 401 is facilitated by making the photodetector and light generating devices significantly larger in surface area than the diameter of the core of the optical fibers.

Electrical connections are made between thick die structure 401 and the underlying FPGA die 5 by providing metal tabs on the side edge of optoelectronic die 4 that sits on FPGA die 5. These metal tabs can be made during fabrication of optoelectronic die 4 by etching deep and wide vias into the face of optoelectronic die 4. When a wafer of optoelectronic devices is diced into discrete optoelectronic dice, the metal filled vias are sectioned, thereby forming exposed metal tabs on the side edges of the optoelectronic die. Conductive glue 406 such as silver epoxy can be used to form electrical contact between the tabs on optoelectronic die 4 and corresponding bond pad areas (not shown) on the upper surface of the underlying FPGA die 5.

Rather than using conductive glue 406 to form electrical connections, protruding micropad structures are in one embodiment provided on the upper surface of FPGA die 5. The side surface of the optoelectronic die assembly structure 401 is smoothed and planarized by chemical mechanical polishing. The tabs on the optoeletric die assembly structure 401 are then pressed onto corresponding receiving protruding micropad structures on FPGA die 5. A relatively small number of connections can be made between the optoelectronic die assembly structure 401 and FPGA die 5 such that the size of the protruding micropad structures can be increased. The increased size of the protruding micropad structures makes them more robust and less susceptible to damage during the assembly process.

Figure 24:
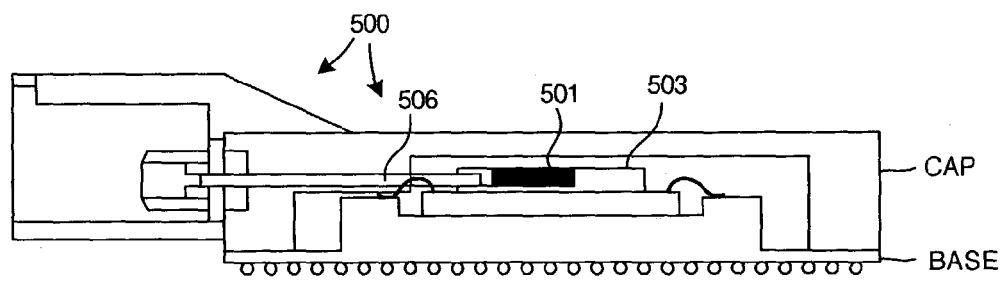
FIGS. 24 and 25 are diagrams of a fifth embodiment of a packaged FPGA integrated circuit.
Figure 25:
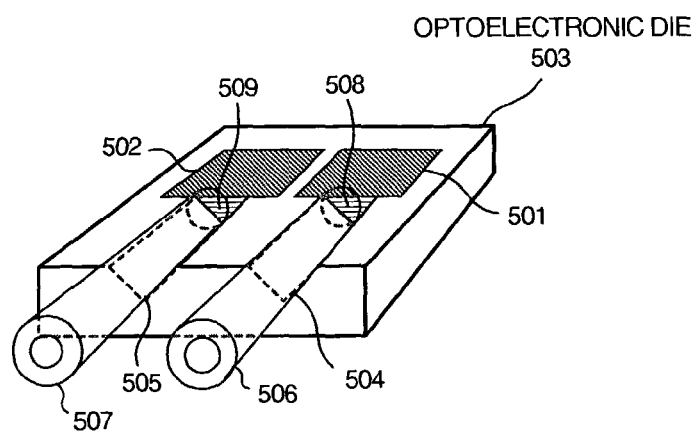

FIG. 24 is a cross-sectional diagram of a fifth embodiment of a packaged FPGA integrated circuit 500 in accordance with the present invention. In this embodiment, the photodetector 501 and light generating device 502 on the optoelectronic die 503 are edge-detecting and edge-emitting devices, respectively. Optoelectronic die 503 is die-bonded to FPGA die 5, for example, using micropad structures as described above. FIG. 25 is an expanded perspective view of optoelectronic die 503. V-shaped alignment grooves 504 and 505 are etched into the upper surface of optoelectronic die 503 to direct the ends of first and second optical fibers 506 and 507 to the edges 508 and 509 of photodetector 501 and light generating device 502, respectively.

Figure 26:
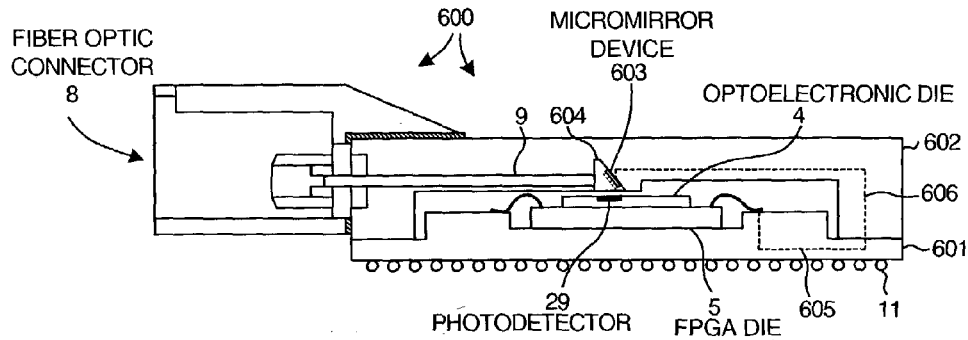
FIG. 26 is a cross-sectional diagram of a sixth embodiment of a packaged FPGA integrated circuit.

FIG. 26 is a cross-sectional diagram of a sixth embodiment of a packaged FPGA integrated circuit 600. Ceramic base portion 601 and ceramic cap portion 602 are shaped in similar fashion to the ceramic base and ceramic cap portions of the embodiment of FIGS. 1–7. Rather than reflecting light from first optical fiber 9 to photodetector 29 using a prism or reflecting surface of reflecting recess 26, and rather than reflecting light from laser diode 30 to the core of second optical fiber 10 using a prism or reflecting surface of reflecting recess 26, in the embodiment of FIG. 26 a micromirror device 603 is mounted on the inside surface of recess 604. Micromirror device 603 is controlled by FPGA die 5 using a signal path that extends from FPGA die 5 and micromirror device 603. Mirror switching waveforms required by micromirror device 603 are generated by FPGA die 5 in one example. The signal path extends from FPGA die 5, through wire bonds, through base portion 601 through electrical conductors 605, then up into cap portion 602 through electrical conductors 606. Conductors 605 and 606 are formed in ceramic portions 601 and 602 as described above in connection with the embodiment of FIGS. 1–7.

Figure 27:
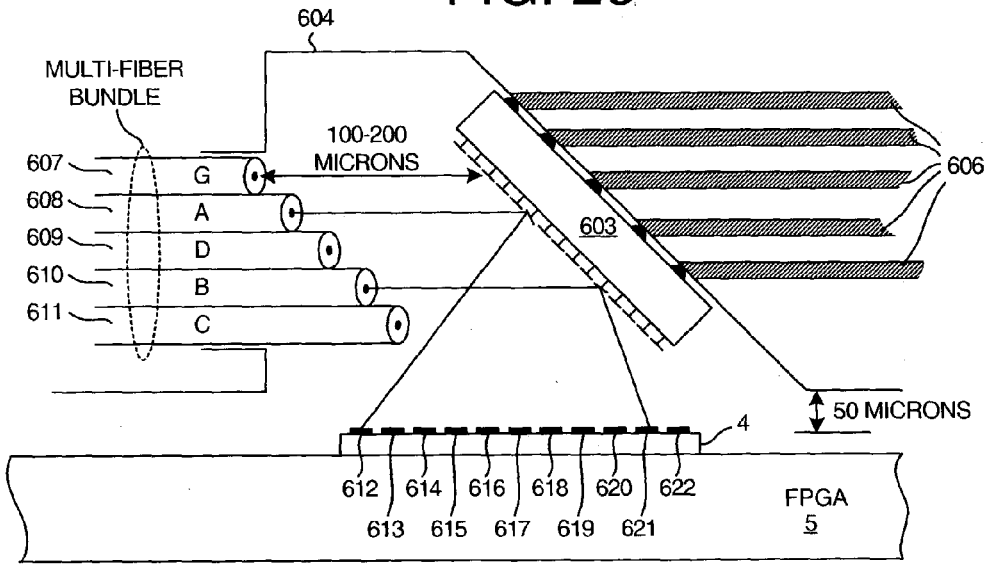
FIG. 27 is an expanded cross-sectional diagram of a micromirror device in accordance with a seventh embodiment of a packaged FPGA integrated circuit.

FIG. 27 is an expanded view of micromirror device 603 disposed in reflecting recess 604. Micromirror device 603 may, for example, be coupled to conductors 606 using ball grid array attachment techniques and structures. The small "T" shaped structures on the surface of micromirror device 603 represent micromirrors. Each individual micromirror may, for example, have a reflecting surface that is approximately 13 microns square. Micromirror device 603 is, for example, a digital multimirror device (DMD) available from the DLP (Digital Light Processing) Products Division of Texas Instruments. Individual micromirrors are spaced less than one micron apart. Alternatively, micromirror device 603 is a micromirror device such as is set forth in the paper entitled "Smart Phase-Only Micromirror Array Fabricated By Standard CMOS Process", by Tuantranont et al, Proceedings of the 13$^{th}$ Annual International Conference on Micro Electromechanical Systems (MEMS2000), pages 455–460, 2000.

In the sixth embodiment, there is one optical fiber 9 through which light passes from connector 8 and through the cap portion 602 to the micromirror device 603. Light that exits optical fiber 9 disperses somewhat after it exits optical fiber 9 and passes across the distance of the reflecting recess 604 to the micromirror device 603. The many individual micromirrors of micromirror device 603 are controlled to focus the dispersing rays of light onto the light sensitive surface of the photodetector 29 on optoelectronic die 4.

In a seventh embodiment, a multifiber bundle passes through the hole in cap portion 602. Each individual fiber of the multifiber bundle may, for example, be 50 microns in diameter. FIG. 27 illustrates multiple optical fibers 607–611 of such a fiber bundle. Photodetector 29 on optoelectronic die 4 in this embodiment actually comprises a set of individual photodetectors 612–622. Micromirror device 603 is controlled by FPGA die 5 so that multiple separate communication channels are established, one communication channel being established between each of the optical fibers and a different one of the photodetectors 612–622.

Figure 28:
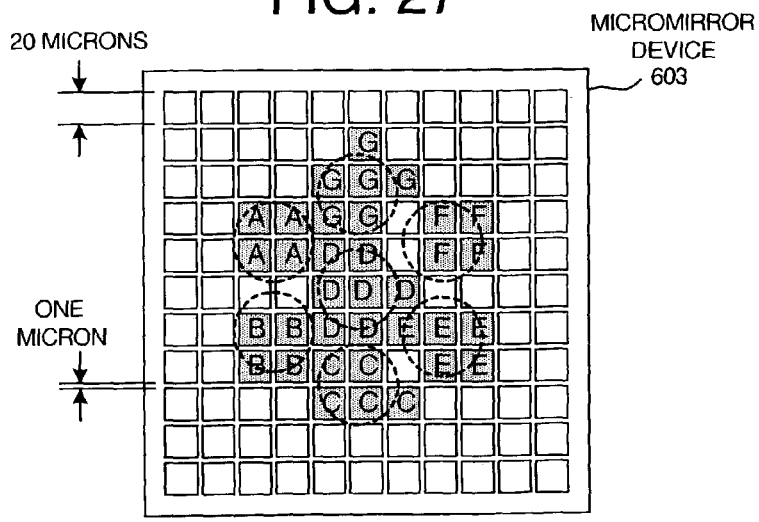
FIG. 28 is a diagram showing how light from a multi-fiber bundle is incident on the various individual micromirrors in accordance with the seventh embodiment.

FIG. 28 illustrates how the light from the various optical fibers 607–611 can be incident on the individual micromirrors of micromirror device 603. For example, if light from optical fiber 607 (designated G) ends up after the assembly process to be incident on the darkened micromirrors labeled "G" in FIG. 28, then these micromirrors are controlled to reflect the light onto one of the individual photodetectors 612–622 on optoelectronic die 4. Similarly, if light from another of the optical fibers 608 (designated A) ends up after the assembly process to be incident on the darkened micromirrors labeled "A" in FIG. 28, then these micromirrors are controlled to reflect the light onto another of the individual photodetectors. If too much light from two different optical fibers ends up to be incident on a single micromirror, then that micromirror can be controlled so that it does not direct light onto the photodetector array. By providing micromirrors of a size that is substantially smaller than the cross section of the optical fibers of the bundle, separation of the light from the various optical fibers onto different photodetectors is facilitated. The ends of the various optical fibers in one embodiment terminate as illustrated in FIG. 27 so that the distance between each of the optical fibers and the micromirror upon which light from the individual fiber is incident is substantially constant for all the optical fibers of the bundle.

Figure 29:
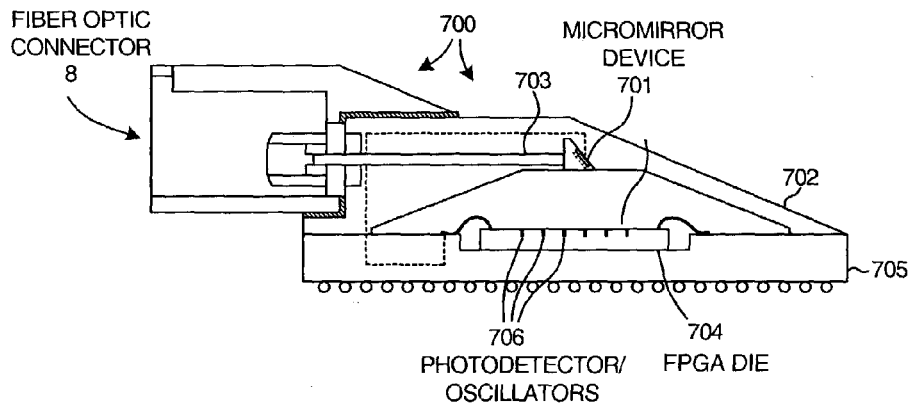
FIGS. 29 and 30 are cross-sectional diagrams of an eighth embodiment of a packaged FPGA integrated circuit.

FIG. 29 illustrates an eighth embodiment of a packaged FPGA integrated circuit 700 in accordance with the present invention. A micromirror device 701 fixed to ceramic cap portion 702 reflects light from a horizontally extending optical fiber 703 down onto a plurality photodetector/oscillators 706. The photodetector/oscillators are distributed across the upper surface of an FPGA die 704. FPGA die 704 and micromirror device 701 are both disposed in a single hermetically sealed chamber formed by ceramic base portion 705 and ceramic cap portion 702. The packaged FPGA integrated circuit 700 includes a fiber optic connector 8 that is fixed to the ceramic cap portion 702 as described above in connection with other embodiments. Optical fiber 703 extends from connector 8, through a horizontally extending hole in cap portion 702, and to micromirror device 701.

Figure 30:
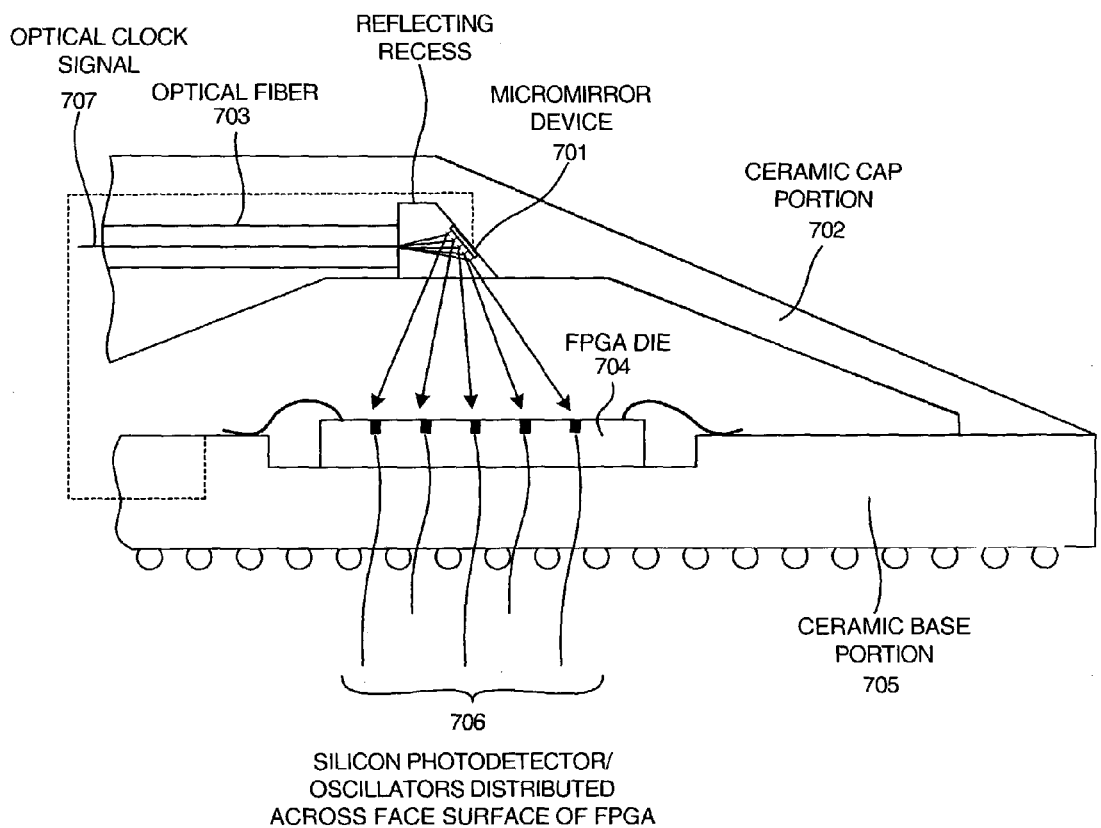

FIG. 30 is an expanded view of the eighth embodiment of FIG. 29. A light signal 707 is conducted from connector 8 to micromirror device 701. This light signal 707 is an amplitude modulated optical clock signal. Light signal 707 exits optical fiber 703 and is incident onto a plurality of micromirrors of micromirror device 701. Each of the individual micromirrors upon which a part of light signal 707 is incident reflects its part of light signal 707 onto a corresponding one of a plurality of photodetector/oscillators 706. Each photodetector/oscillator 706 includes a photodetector coupled to an oscillator. The light received onto the photodetector is converted by the photodetector into a corresponding electrical clock signal. The electrical clock signal is supplied by the photodetector to the oscillator. The oscillator is formed to have a natural oscillating frequency fairly close to the frequency of the clock signal. The oscillator may, for example, be a ring oscillator of CMOS inverters. The electrical clock signal forces the oscillator to oscillate at the same frequency and in phase with the pumping electrical clock signal. In this way, all the oscillators of the photodetector/oscillators of FPGA die 704 are made to receive the same light signal 707 and to oscillate substantially at the same frequency and in phase with the clock signal. The oscillating signal in each photodetector/oscillator is buffered. The buffered clock signal is then made usable locally in the vicinity of the photodetector/oscillator as a clock signal. In this manner, a low clock-skew and relatively jitter-free clock signal is provided across the surface of a large FPGA die 704. Although silicon photodetectors do not generally have the performance characteristics of photodetectors made of other semiconductor materials such as gallium arsenide, silicon photodetectors are suitable for use in the embodiment of FIGS. 29 and 30 where photoelectric conversion efficiency of the photodetectors is not of primary importance.

Figure 31:
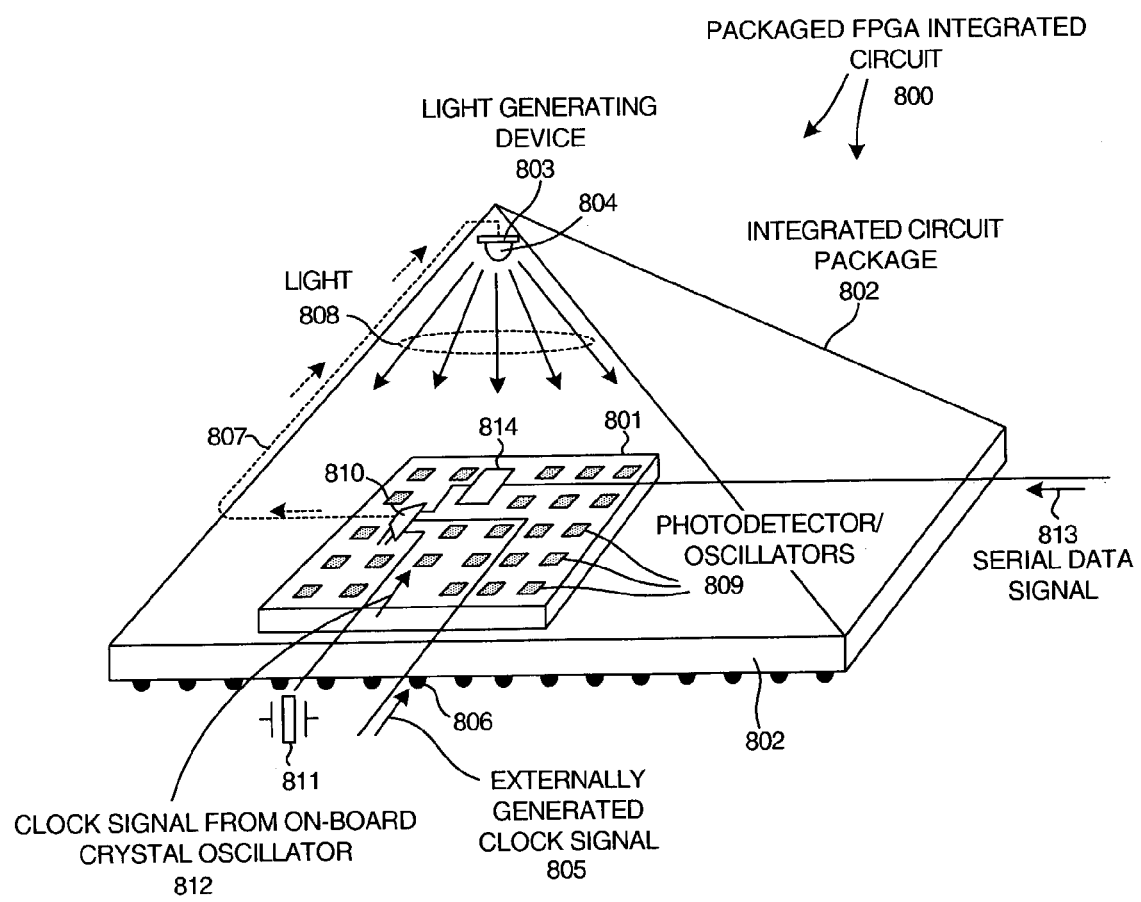
FIG. 31 is a diagram showing a perspective view of a ninth embodiment of a packaged FPGA integrated circuit.

FIG. 31 is a simplified perspective view of a ninth embodiment of a packaged FPGA integrated circuit 800 in accordance with the present invention. Packaged FPGA integrated circuit 800 includes an FPGA die 801 disposed in a hermetically sealed chamber within a pyramid-shaped integrated circuit package 802. Rather than using an optical connector, an optical fiber and a micromirror device to receive an optical signal onto the package and to distribute the optical signal within the package as in the case of the embodiment of FIGS. 29 and 30, no optical connector, no optical fiber and no micromirror is provided in the embodiment of FIG. 31. Rather, a light generating device 803 is provided within the hermetically sealed chamber in the apex of the pyramid-shaped package 802. In one example, the light generating device 803 is a laser diode which is fitted with a light dispersing lens 804. An externally generated electrical clock signal 805 is received onto integrated circuit package 802 via a package terminal. In the present example where the package is a ball grid array package, the electrical clock signal 805 is received by one of the solder bumps 806 on the bottom of the package. The electrical signal is communicated onto the FPGA die 801 in ordinary fashion. The clock signal is then, however, communicated from FPGA die 801, up and through conductor 807 in the package to light generating device 803 at the apex of the package so that the electrical clock signal drives light generating device 803. Light generating device 803 converts the electrical clock signal into a corresponding optical clock signal 808 which is directed downward toward FPGA die 801. The optical clock signal 808 disperses and floods the hermetically-sealed chamber such that it is incident on each of a plurality of photodetector/oscillators 809 disposed across the upper surface of FPGA die 801. The propagation time for the optical signal between the light generating device 803 and each of photodetector/oscillators 809 is substantially identical. Accordingly, as in the case of the embodiment of FIGS. 29 and 30, photodetector/oscillators 809 are all made to oscillate at the same frequency and substantially in phase with each other, thereby providing a low-skew and relatively jitter-free clock signal over the entire surface of the FPGA die 801.

Rather than clocking the FPGA die 801 with externally generated clock signal 805, the FPGA die 801 can be clocked with a clock signal generated using an internal crystal 811 and an associated oscillator circuit on the FPGA die 801. The resulting crystal oscillator clock signal 812 generated by the on-board oscillator circuit can be coupled onto conductor 807 by a multiplexer 810 such that the crystal oscillator clock signal drives the light generating device 803.

The integrated circuit package 802 may also receive a serial data signal 813 without an associated clock signal. A clock recovery circuit 814 provided on FPGA die 801 recovers the clock signal from the serial data signal 813. Multiplexer 810 is controllable to couple the recovered clock signal onto conductor 807 so that the recovered clock signal drives light generating device 803. By converting the recovered clock signal into an optical clock signal, propagating the optical clock signal 808 to the many photodetector/oscillators 809, and then regenerating the recovered clock signal on the FPGA die 801 locally in the oscillators of the photodetector/oscillators, the recovered clock signal is provided across the surface of the FPGA die 801 with low-skew.

Although an external crystal can operate with an on-board oscillator such that the resulting clock signal passes through the integrated circuit 801 on its way to light generating device 803, this need not be the case. In one example, an external crystal oscillator (not shown) is used rather than an external crystal. The integrated circuit package includes a socket to accommodate the terminals of the external crystal oscillator. The socket may, for example, be located on the outside of the package at the apex of the pyramid-shaped package. Power and ground supply voltages are supplied to the external crystal oscillator via conductors that extend up through the integrated circuit package to the socket. The clock signal output by the external crystal oscillator is conducted into the integrated circuit package and to the light generating device disposed at the apex but within the hermetically sealed package.

Although certain specific exemplary embodiments are described above in order to illustrate the invention, the invention is not limited to the specific embodiments. Optical waveguides other than optical fibers can be used to direct light from an optical connector on an integrated circuit package, change the direction of propagation of the light approximately ninety degrees, and cause the light to be incident onto a surface of an optoelectronic die disposed within the package. Although LC type small form factor optical connectors are described in connection with particular embodiments, other types of fiber optic connectors can be used. Although the term die-bonded is used to describe a die that is bonded to a second die, a die-bonded assembly can be made by bonding optoelectronic dice to a wafer of FPGA. The optoelectronic dice disposed on and bonded to the wafer of FPGA device can then be thinned by chemical mechanical polishing. The FPGA wafer can then be cut into many die-bonded assemblies, each die-bonded assembly comprising an optoelectronic die that is die-bonded to an FPGA die. Accordingly, various modifications, adaptations, and combinations of various features of the described embodiments can be practiced without departing from the scope of the invention as set forth in the following claims.

What is claimed is:

1. An apparatus for connecting to an external fiber optic cable, the apparatus comprising:
    a die-bonded assembly, the die-bonded assembly comprising an optoelectronic circuit die that is die-bonded to a logic integrated circuit die, the optoelectronic circuit die comprising a light generating device and a photodetector device, the logic integrated circuit die having an upper surface oriented substantially in a plane; and
    an integrated circuit package comprising a fiber optic connector, a first optical fiber and a second optical fiber, the integrated circuit package encapsulating the die-bonded assembly in a hermetically sealed chamber, wherein first light passing into the integrated circuit package from a first fiber of the external fiber optic cable passes through the fiber optic connector in a direction substantially parallel to the plane, through the first optical fiber, into the chamber, and onto the photodetector device of the optoelectronic die, and wherein second light generated by the light generating device is transmitted out of the integrated circuit package by passing from the light generating device, through the chamber, into the second optical fiber, through the second optical fiber, through the connector in the direction substantially parallel to the plane, and into a second fiber of the external fiber optic cable.

2. The apparatus of claim 1, wherein the integrated circuit package further comprises a ceramic base portion and a ceramic cap portion, the connector of the integrated circuit package being attached to the ceramic cap portion, a first hole and a second hole extending through the ceramic cap portion in the direction substantially parallel to the plane, wherein the first optical fiber extends from the connector and through the first hole in the ceramic cap portion, and
    wherein the second optical fiber extends from the connector and through the second hole in the ceramic cap portion.

3. The apparatus of claim 2, wherein the ceramic cap portion has a dropped ceiling surface and a higher ceiling surface, the dropped ceiling surface being disposed closer to the plane than the higher ceiling surface, wherein the first hole and the second hole extend through the ceramic cap portion in an area above the dropped ceiling portion.

4. The apparatus of claim 2, wherein the integrated circuit package further comprises a prism that redirects the first light passing out of the first optical fiber into a direction perpendicular to the plane, and wherein the prism also redirects the second light generated by the light generating device from a direction perpendicular to the plane into the second optical fiber.

5. The apparatus of claim 2, wherein the ceramic cap portion forms a reflecting surface, the reflecting surface redirecting the first light passing out of the first optical fiber into a direction substantially perpendicular to the plane, the reflecting surface also redirecting the second light generated by the light generating device from a direction substantially perpendicular to the plane into the second optical fiber.

6. The apparatus of claim 1, wherein the logic integrated circuit die has a plurality of input/output buffers disposed around a central core area, a plurality of micropads being disposed on the upper surface of the logic integrated circuit die in the central core area, the optoelectronic circuit die also having a plurality of micropads disposed on a bottom surface of the optoelectronic circuit die, the plurality of micropads on the upper surface of the integrated circuit being coupled to the plurality of micropads on the bottom surface of the optoelectronic circuit die.

7. The apparatus of claim 1, wherein the optoelectronic circuit die is covalently bonded to the logic integrated circuit die.

8. The apparatus of claim 1, wherein the optoelectronic circuit die is cold welded to the logic integrated circuit die.

9. The apparatus of claim 1, wherein the connector comprises a first sleeve member and a first ferrule, the first sleeve member forming an annular inner surface that engages an annular outer surface of the first ferrule, the first ferrule having a bore, the first optical fiber extending at least part way through the bore of the first ferrule, wherein the plane of the upper surface of the logic integrated circuit die intersects the sleeve member.

10. The apparatus of claim 9, wherein an axis of the bore of the first ferrule extends in a direction that is substantially parallel to the plane of the upper surface of the logic integrated circuit die.

11. The apparatus of claim 1, wherein the connector is a duplex LC small form factor (LC SFF) optical connector.

12. The apparatus of claim 1, wherein the light generating device is a vertical cavity surface emitting laser (VCSEL) diode, and wherein the photodetector device is a resonant cavity photodetector (RCPD).

13. The apparatus of claim 1, wherein the first optical fiber extends in a first straight line from the connector and into the chamber, and wherein the second optical fiber extends in a second straight line from the chamber and to the connector.

14. The apparatus of claim 1, wherein the optoelectronic circuit die is substantially thinner than the logic integrated circuit die.

15. The apparatus of claim 1, wherein the external fiber optic cable includes a plug that snap fits into the fiber optic connector of the integrated circuit package.

16. An apparatus, comprising:
an integrated circuit package having a duplex fiber optic connector, a ceramic cap portion, and a ceramic base portion, the duplex fiber optic connector being connected to the ceramic cap portion, the integrated circuit package forming a hermetically sealed chamber;
a die-bonded assembly disposed within the hermetically sealed chamber, the die-bonded assembly comprising an optoelectronic circuit die and a field programmable gate array (FPGA) integrated circuit die, the FPGA integrated circuit die having an upper surface disposed in a plane;
first means for conducting first light from the connector in a direction substantially parallel to the plane, the first means conducting the first light through the ceramic cap portion such that the first light is incident on the optoelectronic circuit die; and
second means for conducting second light from the optoelectronic circuit die through the ceramic cap portion, the second means conducting the second light through the ceramic cap portion in a direction substantially parallel to the plane.

17. The apparatus of claim 16, wherein the first means comprises a first reflective surface and a first optical fiber, and wherein the second means comprises a second reflective surface and a second optical fiber.

* * * * *